(12) United States Patent
Byeon

(10) Patent No.: US 7,660,155 B2
(45) Date of Patent: Feb. 9, 2010

(54) NON-VOLATILE MEMORY DEVICE AND METHOD OF DRIVING THE SAME

(75) Inventor: Dae-seok Byeon, Yongin-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 60 days.

(21) Appl. No.: 11/951,556

(22) Filed: Dec. 6, 2007

(65) Prior Publication Data

US 2008/0205151 A1    Aug. 28, 2008

(30) Foreign Application Priority Data

Feb. 27, 2007    (KR) .................. 10-2007-0019923

(51) Int. Cl.
*G11C 11/34* (2006.01)
(52) U.S. Cl. ................ 365/185.09; 365/185.17; 365/185.18; 365/185.21
(58) Field of Classification Search ............ 365/185.09, 365/185.17, 185.18, 200, 201, 226, 227, 365/180.04, 189.05
See application file for complete search history.

(56) References Cited

U.S. PATENT DOCUMENTS 6,563,732 B2    5/2003  Matarrese et al.
6,751,122 B2 *  6/2004  Kawai et al. ........... 365/185.09
7,224,621 B2 *  5/2007  Nakamura et al. ..... 365/189.04

FOREIGN PATENT DOCUMENTS

JP    2000-322328    11/2000
JP    2002-025292    1/2002

OTHER PUBLICATIONS

English Abstract for Publication No. 2000-322328.
English Abstract for Publication No. 2002-025292.

* cited by examiner

*Primary Examiner*—David Lam
(74) *Attorney, Agent, or Firm*—F. Chau & Associates, LLC

(57) ABSTRACT

A non-volatile memory device capable of stably setting its operating environment and a method of driving the non-volatile memory device are provided. The method includes providing power to the non-volatile memory device having a memory cell array that stores initial setting data for setting the operating environment of the non-volatile memory device. An initial read operation is performed on the memory cell array. The operating environment of the non-volatile memory device is set using the initial setting data that is read through the initial read operation. The initial setting data stored in the memory cell array includes main data having information about the operating environment to be set and an indicator corresponding to the main data for indicating a start and an end of the main data.

24 Claims, 10 Drawing Sheets

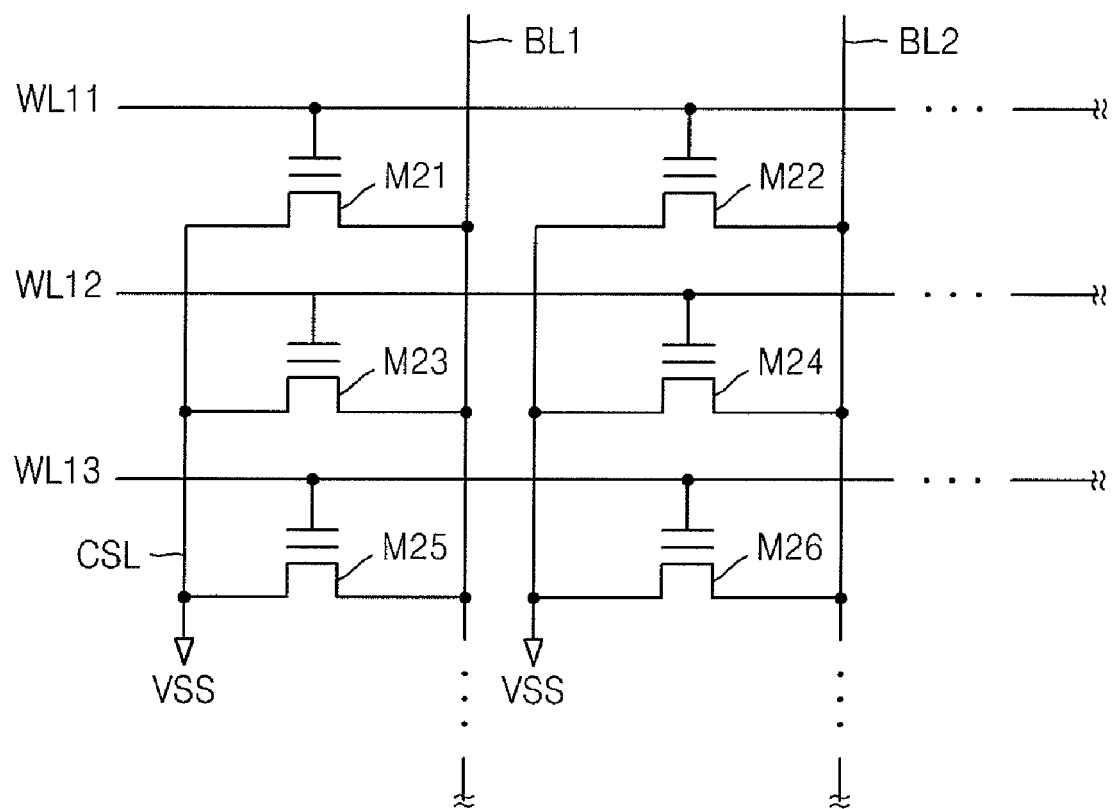

NON-VOLATILE MEMORY DEVICE AND METHOD OF DRIVING THE SAME

CROSS-REFERENCE TO RELATED PATENT APPLICATION

This application claims the benefit of Korean Patent Application No. 10-2007-0019923, filed on Feb. 27, 2007, in the Korean Intellectual Property Office, the contents of which are herein incorporated by reference in their entirety.

BACKGROUND OF THE INVENTION

1. Technical Field

The present invention relates to a memory device, and more particularly, to a non-volatile memory device and a method of driving the same.

2. Discussion of the Related Art

Flash memory is a widely used form of non-volatile memory. Flash memory has short access times like a storage medium based on a magnetic disk, such as a hard disk, but consumes less power.

Flash memory can be classified as a NOR type or a NAND type according to the connection state between cells and bit lines of the flash memory. NOR type flash memory is configured such that two or more cell transistors are connected to one bit line in parallel. NOR type flash memory stores data using channel hot electrons and erases data using Fowler-Nordheim (F-N) tunneling. NAND type flash memory is configured such that two or more cell transistors are connected to one bit line in series. NAND type flash memory writes and erases data using the F-N tunneling. Although NOR type flash memory uses a relatively large amount of cell current, it can function at relatively high speeds. NAND type flash memory uses a small amount of cell current and is thus particularly suited for highly-integrated devices.

FIG. 1A is a circuit diagram of a memory cell included in a general NAND type flash memory. In FIG. 1A, a plurality of word lines WL11 to WL14 and a plurality of memory cells M11 to M14 are illustrated, and the plurality of memory cells M11 to M14 form a string with selective transistors ST1 and ST2 and are connected in series between a bit line BL and a ground voltage VSS. Since NAND type flash memory uses a relatively small amount of cell current, programming for all memory cells connected to a single word line (for example, WL11 to WL14) may be performed through a single program operation.

FIG. 1B is a circuit diagram of a memory cell included in a general NOR type flash memory. As illustrated in FIG. 1B, memory cells M21 to M26 are connected between a bit line BL1 or BL2 and a source line CSL. Since the NOR type flash memory consumes a relatively large amount of cell current during a program operation, only a predetermined number of memory cells may be programmed during a single program operation.

In general, a memory cell array included in a memory device includes a main cell for storing data and a redundancy cell that may substitute for a defective cell of the main cell if the main cell has a defect. The memory cell may also include a fuse circuit for storing an address of the defective cell, i.e., a defect address. The fuse circuit checks if a provided address corresponds to the address of the defective cell and replaces the address of the defective cell with an address corresponding to the redundancy cell.

The fuse circuit stores information for setting the operating environment of the memory device when the memory device is powered on and also stores address information for repairing the defective cell in the manner discussed above. The information for setting the operating environment of the memory cell may comprise initial setting data and may include data for controlling a direct current (DC) voltage associated with an operation of the memory device such as a program operation, a read operation, and an erase operation.

When the initial setting data is stored in the fuse circuit, the initial setting data that sets the operating environment is difficult to change. To improve the flexibility of the operating environment of the memory device, the initial setting data stored in the memory cell array is reprogrammed.

FIG. 2 is a block diagram of a memory cell array 10 in which page buffers and bit lines are arranged. Referring to FIG. 2, the memory cell array 10 includes at least one block (Block 0 to Block n), in which a plurality of bit lines BLe and BLo are arranged as pairs. A page buffer unit 20 includes a plurality of buffers, each of which is electrically connected to a corresponding bit-line pair. A page may be defined as a unit in which a program or read operation may be performed in a flash memory. Each page generally has a size of 512 bytes or 2K bytes.

FIG. 3 is a block diagram of a memory cell array having a redundancy cell array 40 and page buffers. Referring to FIG. 3, the memory cell array includes a main cell array 30 and the redundancy cell array 40 corresponding thereto. For example, the redundancy cell array 40 is arranged to repair a fail column in the main cell array 30.

A first buffer unit 50 including a plurality of page buffers corresponds to the main cell array 30. Each of the plurality of page buffers included in the first buffer unit 50 is electrically connected to a corresponding bit-line pair of the main cell array 30. A second buffer unit 60 including a plurality of page buffers corresponds to the redundancy cell array 40. Each of the plurality of page buffers included in the second buffer unit 60 is electrically connected to a corresponding bit-line pair of the redundancy cell array 40.

As illustrated in FIG. 3, in a plurality of bit lines arranged in the memory cell array, a fail column may be present due to a cutoff of a bit line or a short circuit between bit lines during a manufacturing process. When the fail column is present, it is replaced with a redundancy column through a repair process. In the repair process, when a memory device is powered on, a defect address stored in the main cell array 30 is read and is then stored in a predetermined region. Thereafter, if some of the addresses of columns that are input by a user during a program operation, a read operation, or an erase operation, correspond to a defect address, fail columns corresponding to the defect address are replaced with the redundancy column. In FIG. 3, during the repair process, fail columns present in the main cell array 30 are replaced with the redundancy column in units of two page buffers. Two page buffers 51 corresponding to bit lines including fail columns are replaced with two page buffers 61 corresponding to redundancy columns.

As mentioned above, once power is on, a conventional non-volatile memory device reads initial setting data stored in a memory cell array through an initial read operation and sets its operating environment according to the read setting data. However, since the initial setting data is read prior to a repair process, the initial setting data may be read from an array including a fail column. As a result, the read initial setting data may have an error and in this case, the memory device may not be set to operate in a desired mode.

SUMMARY OF THE INVENTION

Exemplary embodiments of the present invention provide a non-volatile memory device and a method of driving the same, in which initial setting data can be stably read from a memory cell array regardless of whether a fail column is present.

According to one aspect of the present invention, there is provided a method of driving a non-volatile memory device.

The method includes providing power to the non-volatile memory device. The non-volatile memory device has a memory cell array that stores initial setting data associated with the operating environment of the non-volatile memory device. An initial read operation is performed on the memory cell array, and the operating environment of the non-volatile memory device is set using the initial setting data that is read through the initial read operation. The initial setting data stored in the memory cell array includes main data having information about the operating environment to be set and an indicator for indicating features of the main data.

The method may include detecting an address of a fail column by testing a plurality of bit lines included in the memory cell array and storing the initial setting data in a normal column region that is not the fail column.

The setting of the operating environment may include sensing the indicator from the result of the initial read operation and providing the main data corresponding to the indicator to the internal circuit of the non-volatile memory device according to the sensing result.

The indicator may include start information indicating the start of the main data and end information indicating the end of the main data.

The setting of the operating environment may include sensing the start information from the result of the initial read operation, providing the main data to the internal circuit in response to the start information, and terminating the operation of providing the main data in response to the end information.

The indicator may include start information indicating the start of the main data that is set to a predetermined size.

The setting of the operating environment may include sensing the start information from the result of the initial read operation, providing the main data to the internal circuit in response to the start information, and providing the main data having the predetermined size and terminating the operation of providing the main data.

The initial setting data may include N-bytes of main data for setting a predetermined operation. The N-bytes of main data may be grouped into a plurality of data groups. The initial setting data may additionally include an indicator corresponding to each of the plurality of data groups. N is an integer greater than 1.

According to another aspect of the present invention, a method of driving a non-volatile memory device is provided. The method includes storing main data having information for setting the operating environment of the non-volatile memory device and an indicator corresponding to the main data. A read operation is performed on a memory cell array according to an auto-read operation that is performed when power is provided to the non-volatile memory device. The indicator is sensed from data that is output through the read operation. The main data corresponding to the sensed indicator is provided to an internal circuit, thereby setting the operating environment of the non-volatile memory device. The main data and the indicator are stored in a normal column region based on a result of testing a plurality of bit lines included in the memory cell array. The normal column region is free of defects.

According to another aspect of the present invention, a non-volatile memory device is provided. The non-volatile memory device includes a memory cell array storing initial setting data associated with an operation for setting the operating environment of the non-volatile memory device. An input/output buffer temporarily stores or outputs data provided from the memory cell array in response to a control signal. An indicator sensing unit performs a sensing operation for data that is read through an initial read operation with respect to the memory cell array when power is applied to the non-volatile memory device, provides the control signal corresponding to the sensing result to the input/output buffer, and controls the input/output buffer to provide the initial setting data to an internal circuit of the non-volatile memory device. The initial setting data stored in the memory cell array includes main data having information about the operating environment to be set and an indicator corresponding to the main data for indicating features of the main data.

BRIEF DESCRIPTION OF THE DRAWINGS

The above and other features and aspects of the exemplary embodiments of the present invention will be describing in detail with reference to the attached drawings in which:

FIG. 1B is a circuit diagram of a memory cell included in a NOR type flash memory;

DETAILED DESCRIPTION OF THE EXEMPLARY EMBODIMENTS

Figure 1A:
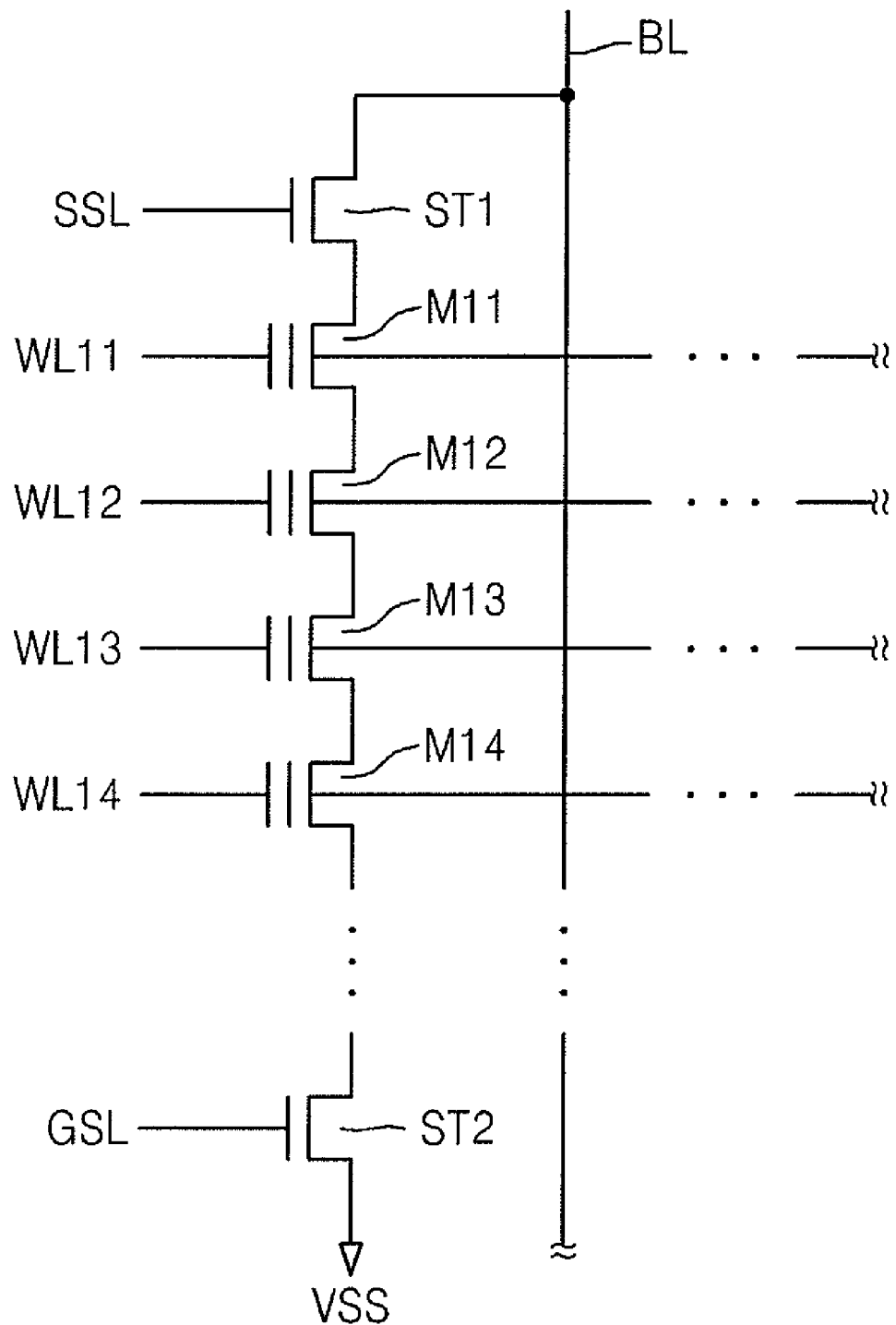
FIG. 1A is a circuit diagram of a memory cell included in a NAND type flash memory.
Figure 2:
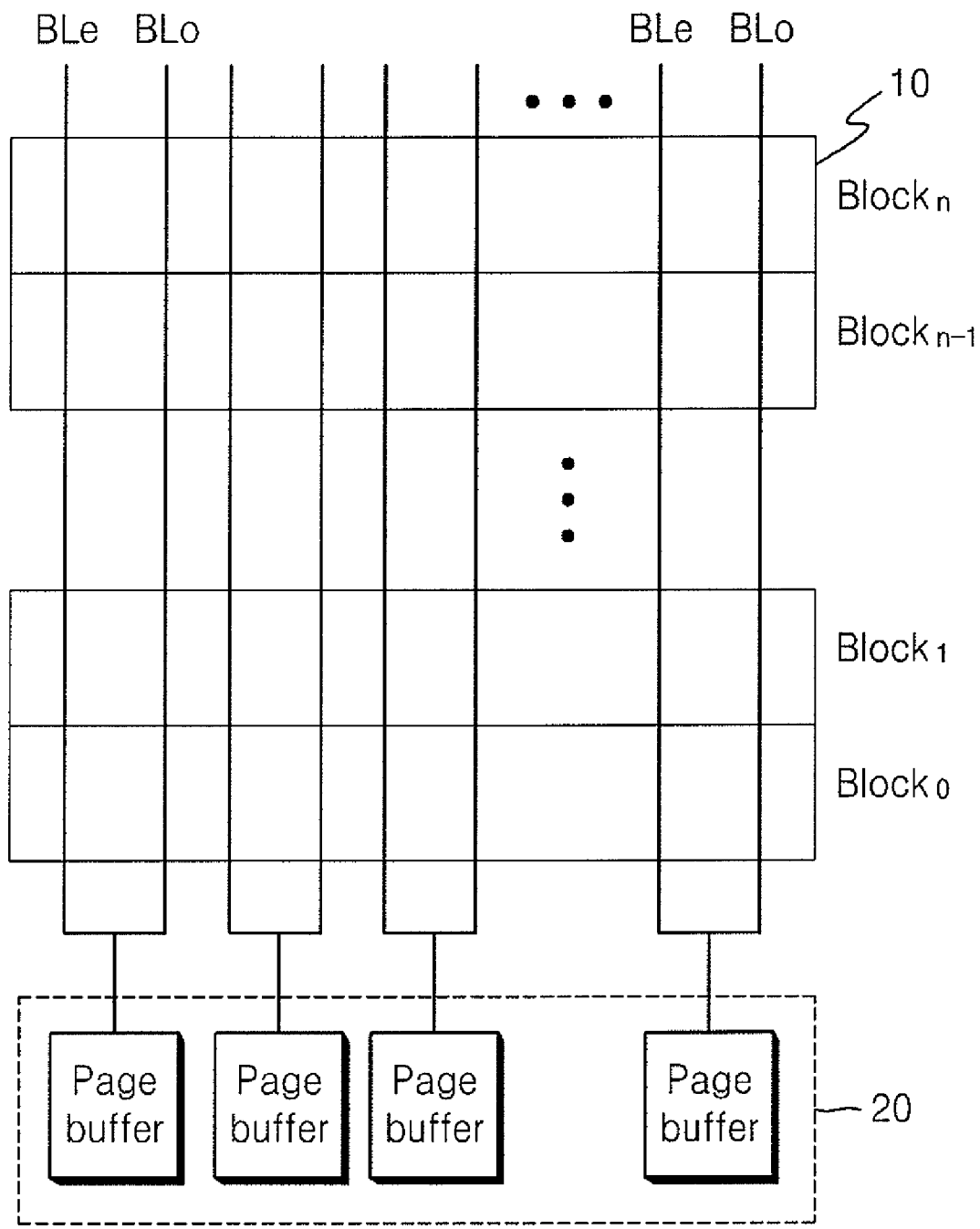
FIG. 2 is a block diagram of a memory cell array in which bit lines and page buffers are arranged according to the prior art.
Figure 3:
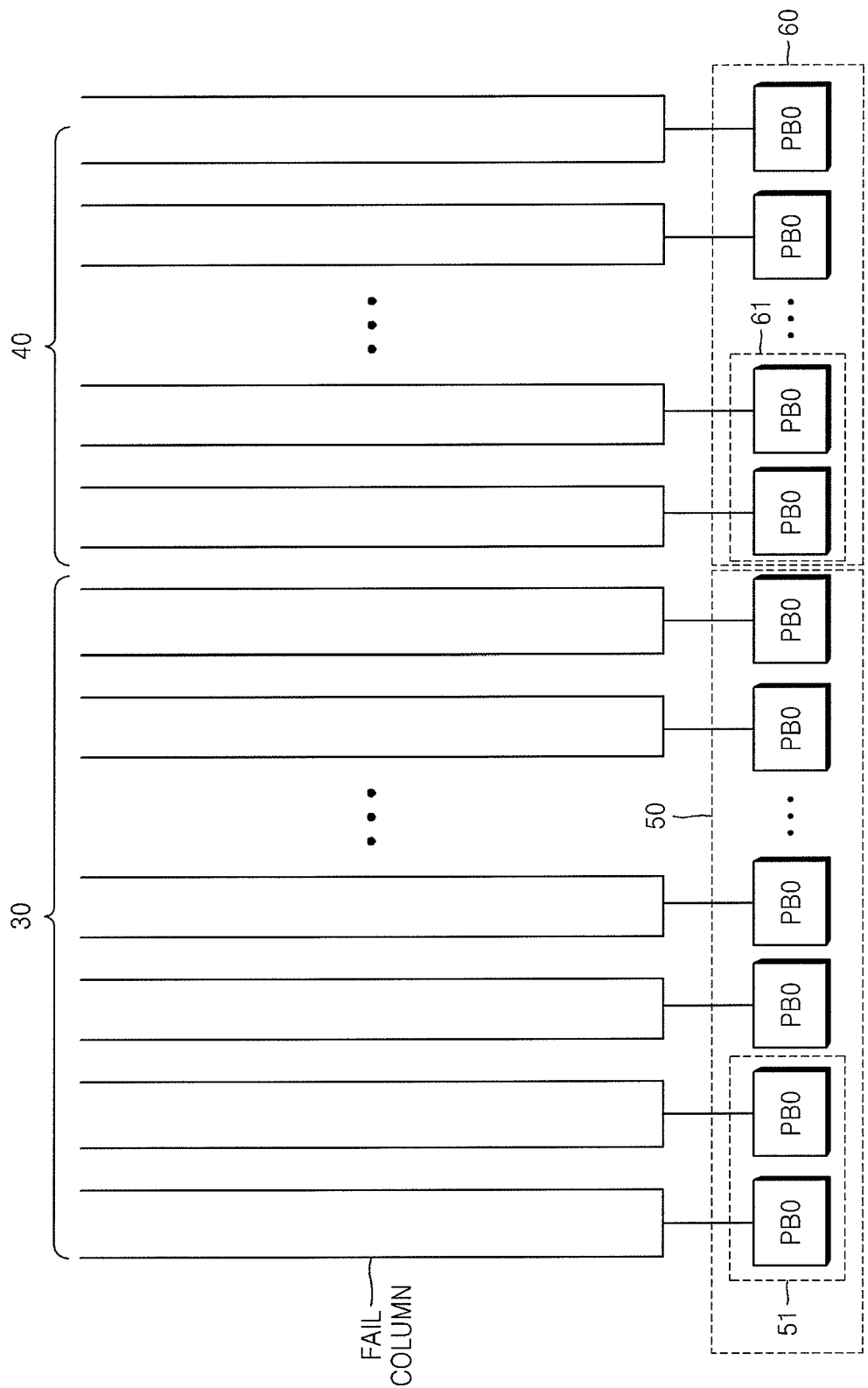
FIG. 3 is a block diagram of a memory cell array having a redundancy cell array and page buffers according to the prior art.

Exemplary embodiments of the present invention will be described below with reference to the accompanying drawings. Like reference numerals may refer to like elements illustrated in one or more of the drawings.

Figure 4:
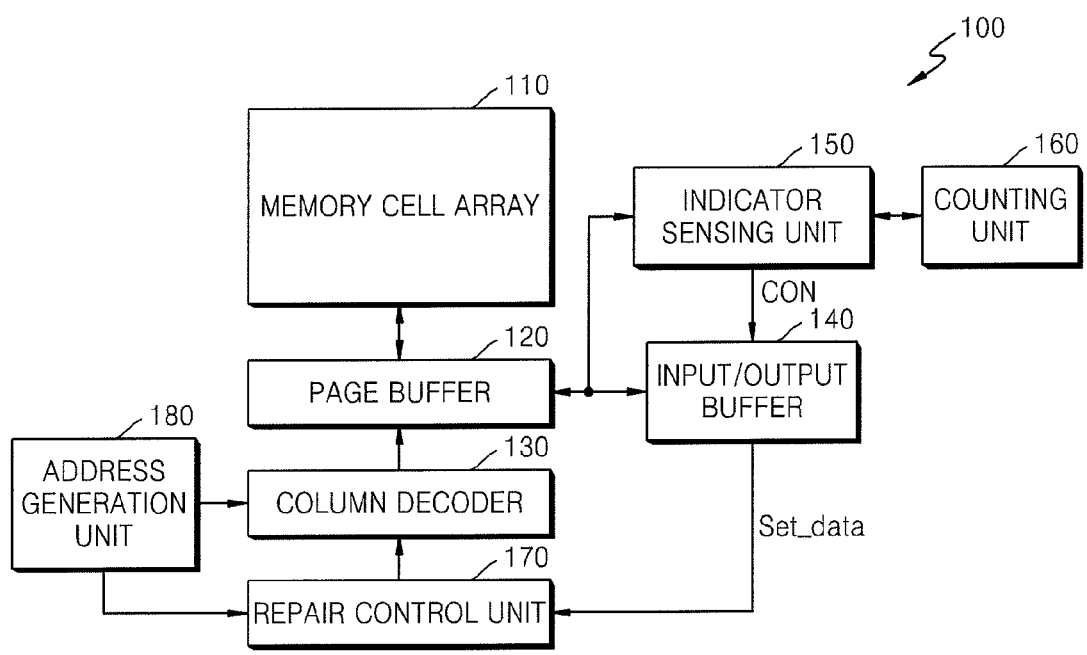
FIG. 4 is a block diagram of a non-volatile memory device according to an exemplary embodiment of the present invention.

FIG. 4 is a block diagram of a non-volatile memory device 100 according to an exemplary embodiment of the present invention. Referring to FIG. 4, the non-volatile memory device 100 includes a memory cell array 110, a page buffer 120, a column decoder 130, and an input/output buffer 140. The memory cell array 110 includes a cell array for storing data and a redundancy cell array for repairing the cell array. The page buffer 120 operates as a sense amplifier during a read operation and stores data that is output from the memory cell array 110. The column decoder 130 receives a column address and decodes the received column address and selects one or more of the bit lines of the memory cell array 110. The input/output buffer 140 receives data that is read from the page buffer 120 and outputs the read data in response to a predetermined control signal.

The memory cell array 110 stores initial setting data associated with setting the operating environment of the memory device 100. For example, the non-volatile memory device 100 may include an indicator sensing unit 150 that senses the initial setting data from read data and provides a control signal CON corresponding to the sensing result to the input/output buffer 140. When the initial setting data has a size of equal to a predetermined number of bytes, the non-volatile memory device 100 may further include a counting unit 160 that performs a count operation according to the size of the predetermined number of bytes. A repair control unit 170 receives address information Set_data of a fail column during an initial setting operation. If a fail column is accessed, the repair control unit 170 senses the access and replaces the fail column with a redundancy column. An address generation unit 180 generates an address for an access to the memory cell array 110 and provides the generated address to each circuit block of the non-volatile memory device 100.

The operation of a non-volatile memory device 100 according to an exemplary embodiment of the present invention is described below.

The memory cell array 110 stores the initial setting data associated with setting the operating environment of the non-volatile memory device 100. The initial setting data includes main data having information about the operating environment to be set and an indicator for indicating features of the main data. For example, the main data may include information about a fail address for a repair operation and/or information for trimming a direct current (DC) voltage associated with an operation such as a program operation, a read operation, or an erase operation.

Once the non-volatile memory device 100 is powered on, an initial read operation is performed on the memory cell array 110 and the operating environment of the non-volatile memory device 100 is set. During the initial read operation, data including the initial setting data stored in the memory cell array 110 is read and provided to the page buffer 120. The data provided to the page buffer 120 is then provided to the input/output buffer 140, and the data provided to the input/output buffer 140 is provided to internal circuits of the non-volatile memory device 100 according to the predetermined control signal CON.

The main data included in the initial setting data is provided to a corresponding internal circuit and the operating environment is set for each of the internal circuits. The indicator sensing unit 150 senses the initial setting data from the page buffer 120. For example, the indicator sensing unit 150 senses the indicator corresponding to the main data that is used to set the operating environment and provides the control signal CON corresponding to the sensing result to the input/output buffer 140. The input/output buffer 140 provides the main data to a corresponding internal circuit based on the control signal CON. For example, when the main data is associated with a repair operation for a fail column, the main data is provided to the repair control unit 170.

When the initial setting data including the main data and the indicator corresponding thereto is stored in the memory cell array 110, a storage operation is performed based on the result of initial testing. Initial testing is generally performed during manufacturing to test for defective bit lines. For example, an address of a fail column is detected according to the test result, and the initial setting data is stored in a normal column region other than in a fail column region. The initial setting data is stored in the normal column region and the initial setting data that is separately stored in the normal column region is sensed using the indicator. Accordingly, an error in reading the initial setting data due to a fail column or a failure in setting an operating environment due to the error may be avoided.

When the indicator sensing unit 150 senses the indicator from the data provided from the page buffer 120 and provides the control signal CON corresponding to the sensing result to the input/output buffer 140, the input/output buffer 140 provides the main data corresponding to the indicator to a corresponding internal circuit. For example, the indicator may include start information indicating the start of the main data and end information indicating the end of the main data. The start information may be positioned in front of the main data and the end information may be positioned behind the main data.

When the indicator sensing unit 150 senses the start information corresponding to the main data, it provides the control signal CON corresponding to the sensing result to the input/output buffer 140. The input/output buffer 140 provides the main data to the internal circuit in response to the control signal CON. Thereafter, the indicator sensing unit 150 senses the end information corresponding to the main data and generates the control signal CON corresponding to the sensing result. The input/output buffer 140 finishes providing the main data and terminates the providing of the main data in response to the control signal CON.

When the main data for setting a predetermined operation of the non-volatile memory device 100 has a fixed size of N bytes, in which N is an integer greater than 1, the indicator corresponding to the main data may include the start information indicating the start of the main data. For example, the start information may be positioned in front of the main data.

In this case, once the indicator sensing unit 150 senses the start information corresponding to the N-byte main data, it provides the control signal CON corresponding to the sensing result to the input/output buffer 140. The indicator sensing unit 150 is electrically connected to the counting unit 160 and provides the sensing result to the counting unit 160.

The counting unit 160 performs a counting operation corresponding to the N-byte size of the non-volatile memory device 100. The counting unit 160 starts the counting operation as the indicator sensing unit 150 senses the start information. Upon completion of the counting operation corresponding to the N-byte size of the non-volatile memory device 100, the counting unit 160 provides a signal indicating the completion of the counting operation to the indicator sensing unit 150. The indicator sensing unit 150 senses the indicator and controls the input/output buffer 140 to provide the main data corresponding to the sensed indicator to the internal circuit. Thereafter, the indicator sensing unit 150 generates the control signal CON upon receipt of the signal indicating the completion of the counting operation, and the input/output buffer 140 finishes providing the main data and terminates the providing of the main data in response to the control signal CON.

In the above description, the main data for setting a predetermined operation of the non-volatile memory device 100 and the indicator corresponding to the main data are grouped and the grouped data is stored as the initial setting data in the memory cell array 110. For example, when the main data has a size of 8 bytes and each of the start information and the end information has a size of 1 byte, the initial setting data may have a size of 10 bytes.

The main data for setting a predetermined operation of the non-volatile memory device 100 may be grouped into a plurality of groups. For example, the 8-byte main data may be grouped into four 2-byte data groups and the indicator may be positioned in each of the data groups. For example, each of the data groups may have a size of 4 bytes, 2 bytes of which constitute the main data and the other 2 bytes of which constitute the indicator. When the indicator includes only the start information, each of the data groups may have a size of 3 bytes, 2 bytes of which constitute the main data and the other 1 byte of which constitutes the indicator.

Figure 5:
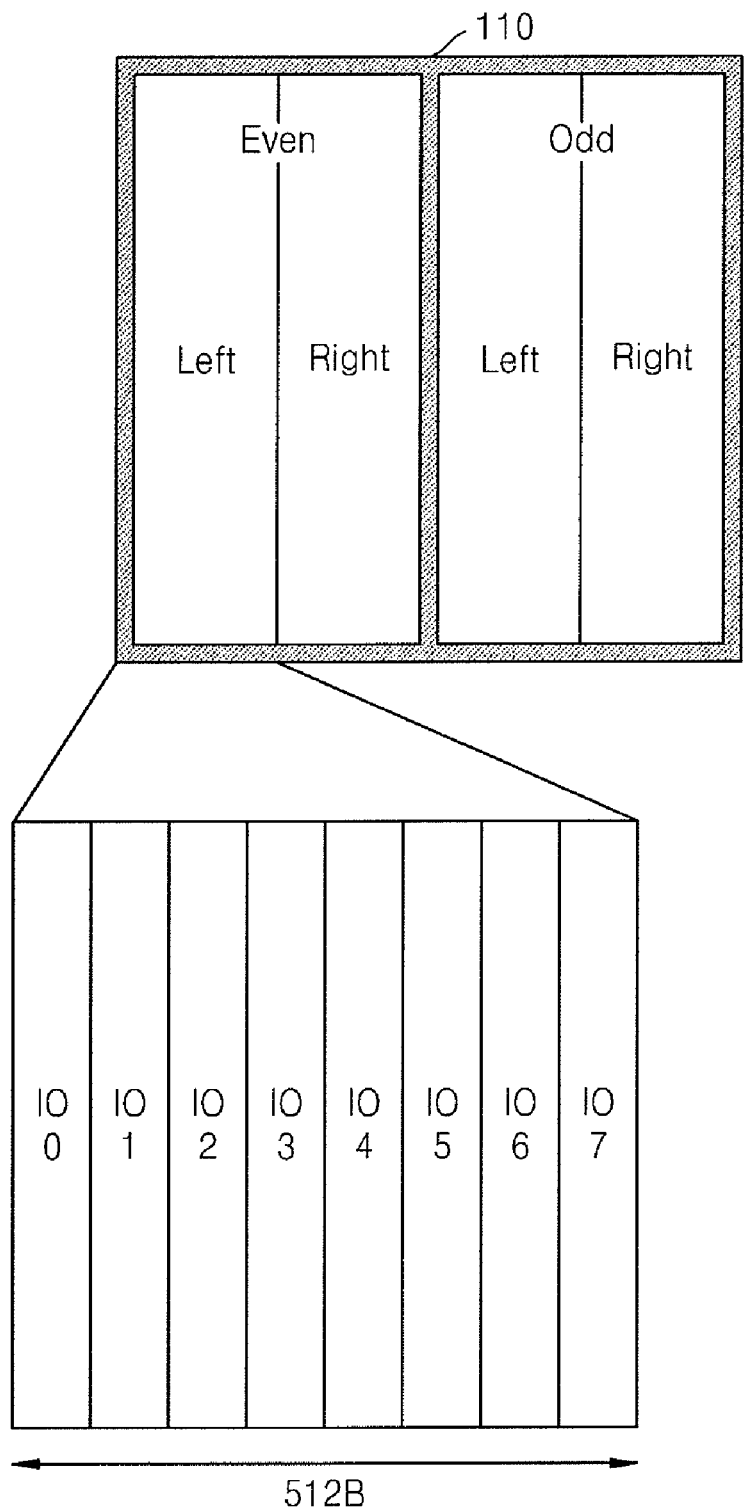
FIG. 5 illustrates the structure of a memory cell array included in the non-volatile memory device illustrated in FIG. 4.

FIG. 5 illustrates the structure of the memory cell array 110 included in the non-volatile memory device 100 illustrated in FIG. 4. The memory cell array 110 may be divided into an even region and an odd region for an interleaving operation. Each of the even region and the odd region may also be divided into a left region and a right region. When a page unit of the memory cell array 110 includes 2 kilobytes, each of the left regions and the right regions include 512 bytes. For example, the left region of the even region may include a column corresponding to 8 input/output units IO0 to IO7. 8 bits output from each of the input/output units correspond to 1-byte of data.

Figure 6:
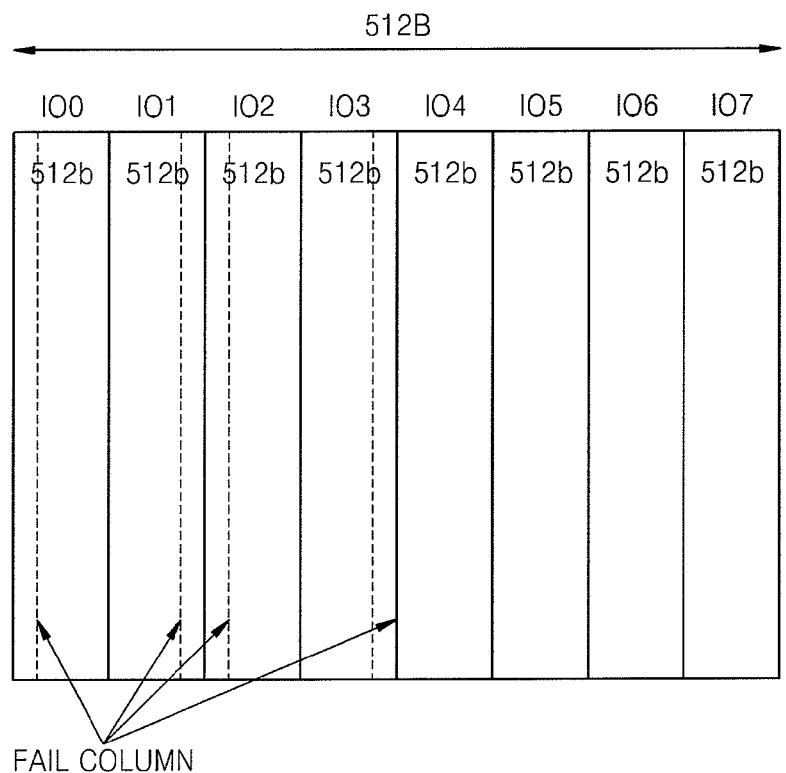
FIG. 6 illustrates generation of fail columns.

FIG. 6 illustrates generation of fail columns according to an exemplary embodiment of the present invention. 8 input/output units IO0 to IO7 illustrated in FIG. 6 correspond to a 512-byte column, and each of the fail columns may be located at any position within each of the input/output units.

Figure 7A:
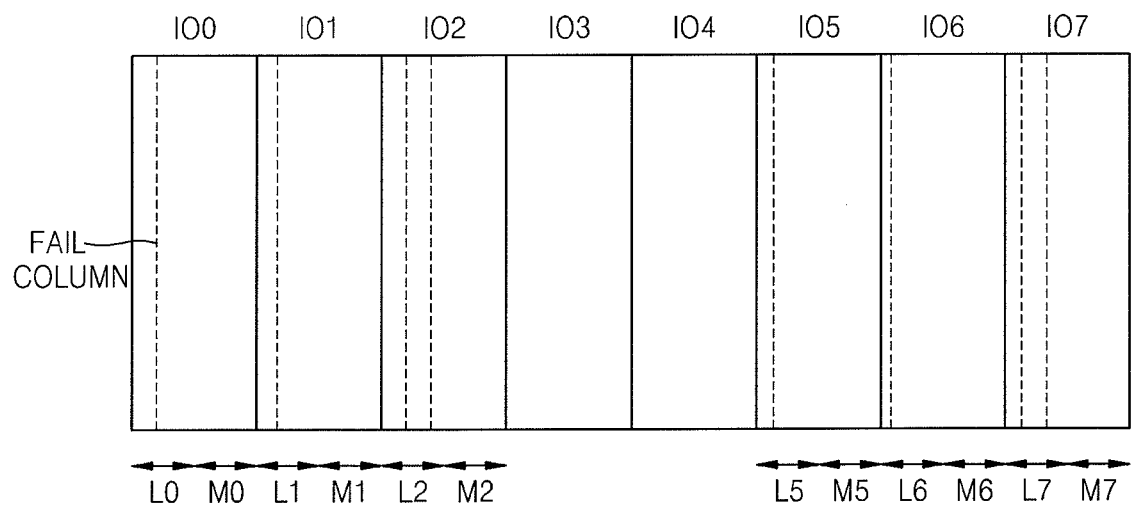
FIGS. 7A and 7B illustrate examples in which fail columns are located in an input/output (IO) unit illustrated in FIG. 6.
Figure 7B:
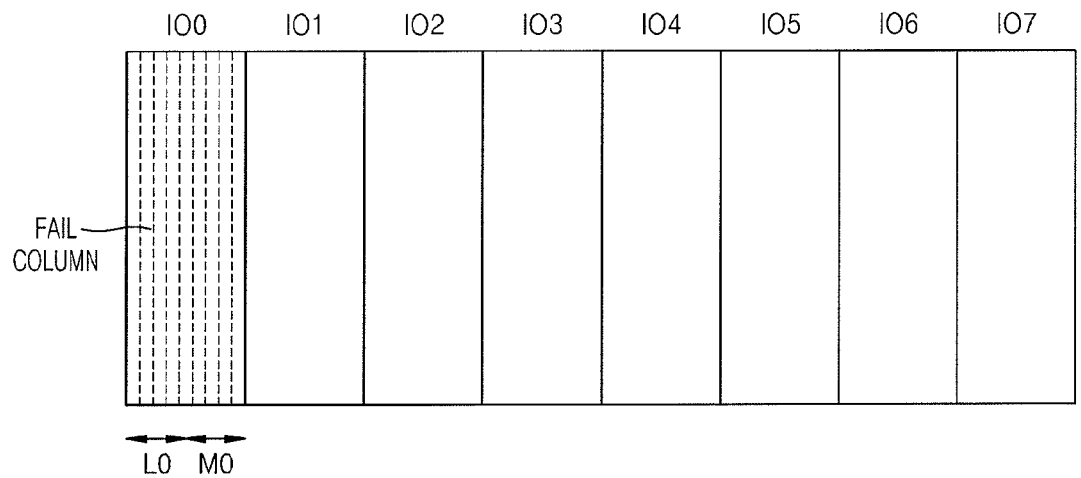

FIG. 7A illustrates an example in which a fail column is located in a front end portion of each of the input/output units illustrated in FIG. 6, and FIG. 7B illustrates an example in which fail columns are located at uniform intervals in a particular input/output unit illustrated in FIG. 6. As illustrated in FIG. 7A, a fail column may be located in a corresponding position of each of at least one input/output units IO0 to IO2 and IO5 to IO7. For example, in FIG. 7A, a fail column is generated in front end portions L0 to L2 and L5 to L7 among 512 bits of each of the input/output units.

The address of the fail column can be detected based on the result of an initial test, for example, performed during the manufacturing process of the non-volatile memory device 100. If the fail column is generated as illustrated in FIG. 7A as a result of the detection, initial setting data including main data and an indicator corresponding thereto may be stored in end portions M0 to M7 among 512 bits of each of the input/output units. Thus, valid initial setting data can be read during the initial read operation for setting the operating environment of the non-volatile memory device 100.

When the fail columns are located at uniform intervals in the particular input/output unit IO0 as illustrated in FIG. 7B, the initial setting data can also be stored in the above-described manner. For example, when the 8 input/output units IO0 to IO7 correspond to 512 bytes, the particular input/output unit IO0 corresponds to 512 bits and 512 page buffers are provided for the 512 bits. If 8 fail columns are generated at uniform intervals in the particular input/output unit IO0, an interval between every two fail columns corresponds to 64 bits. Thus, when initial setting data including main data and an indicator corresponding thereto includes 10 bytes, 10-bit data can be stored consecutively between every two fail columns of the input/output unit IO0. Thus, 10-byte initial setting data can be stored in a normal region of an array of the 8 input/output units IO0 to IO7.

Figure 8A:
FIGS. 8A to 8C illustrate main data and an indicator included in initial setting data.
Figure 8B:
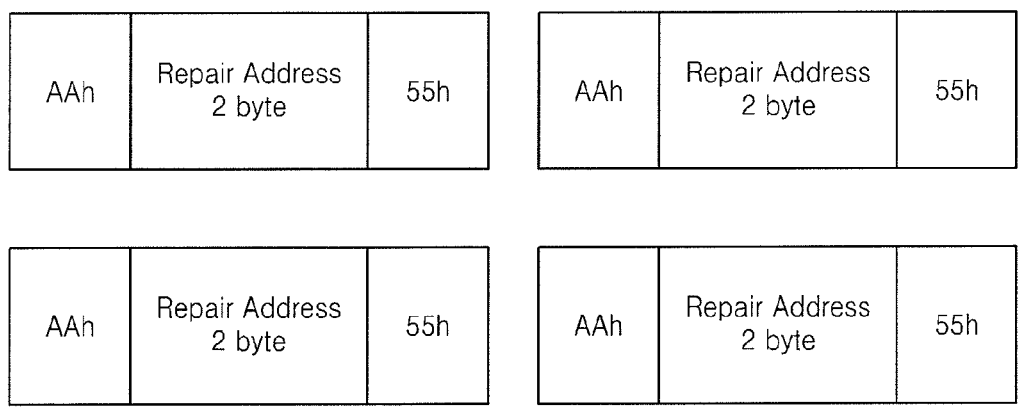
Figure 8C:
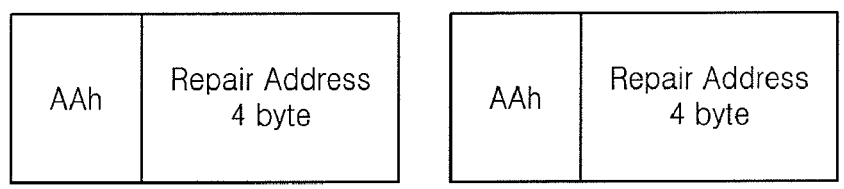

FIGS. 8A to 8C illustrate main data and an indicator included in initial setting data. In FIG. 8A, main data having information for setting a predetermined operation of a memory device includes 8 bytes, start information AAh corresponding to the main data includes 1 byte, and end information 55h corresponding to the main data includes 1 byte. As mentioned above, the main data may be address information associated with the repair operation or information for controlling a DC voltage.

In FIG. 8B, 8-byte main data is divided into four groups. As illustrated in FIG. 8B, the 8-byte main data can be grouped into four 2-byte groups and an indicator is included in each of the groups. Each of the groups may include 2-bytes of main data, 1-byte of start information, and 1-byte of end information. When the main data has specific size, the end information need not be included. In FIG. 8C, the 8-byte main data is grouped into two 4-byte groups and 1-byte start information AAh may be included in each of the groups.

Figure 9:
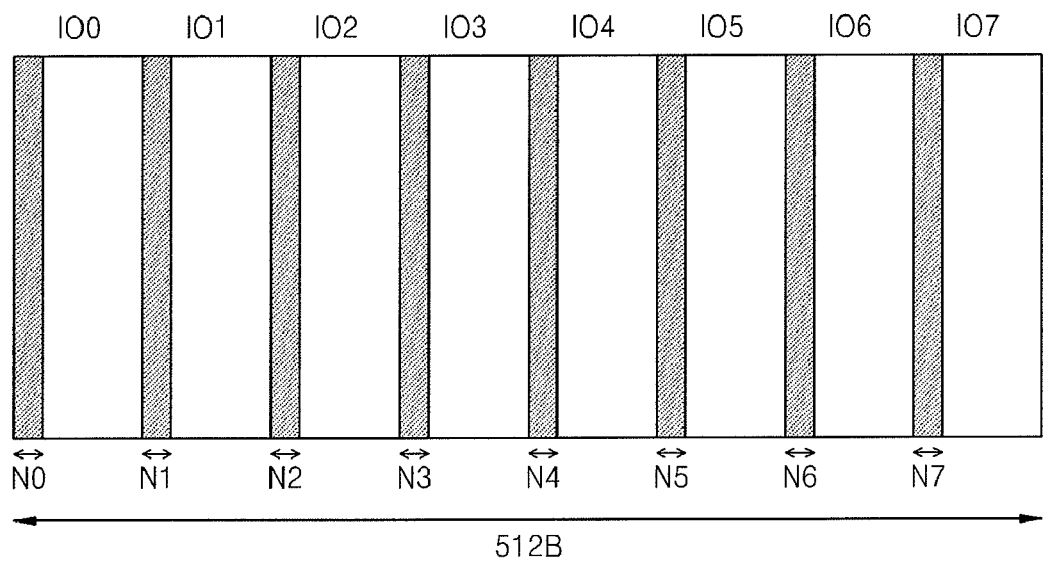
FIG. 9 is a diagram for explaining an operation of a non-volatile memory device according to an exemplary embodiment of the present invention.

FIG. 9 is a diagram for explaining an operation of a non-volatile memory device according to an exemplary embodiment of the present invention.

As illustrated in FIG. 9, a memory cell array may be divided into an even region and an odd region. Each of the even region and the odd region can also be divided into a left region and a right region. 8 input/output units IO0 to IO7 may correspond to a 512-byte column of the memory cell array, and 512 page buffers may be included in each of the input/output units IO0 to IO7.

When an initial test is performed during production of the memory device to check for the presence of a fail column, a particular region of the memory cell array is tested and if a fail column is not present in the particular region, the memory device is processed as a good product. If a fail column is present in the particular region, the memory device is processed as an inferior product. For example, the presence of a fail column is detected from particular regions N0 to N7 of 8 input/output units IO0 to IO7, and if a fail column is not present in any one of the regions N0 to N7, a memory device is processed as a good product.

The particular regions N0 to N7 that are subject to the detection may be set to a predetermined size. For example, the particular regions N0 to N7 may correspond to 10 bytes, the memory device is processed as a good product if a fail column is not present over the 10 bytes. Although the test is performed for the first 10 bytes of the input/output units IO0 to IO7 in FIG. 9, the region that is subject to the test can be arbitrarily set.

When the test is performed in the above-described manner, initial setting data including main data and an indicator corresponding thereto may be stored in the region of the memory cell array that is subject to the test. The initial setting data is stored in a particular region of the memory cell array, and thus the indicator corresponding to the main data may not be required. Moreover, as a result of testing the region in which the initial setting data is stored, the memory device is processed as an inferior product if it is determined that a fail column is generated, and the memory device is processed as a good product if it is determined that a fail column is not generated. Thus, a mass-produced memory device makes initial setting data valid when setting an operating environment.

Figure 10:
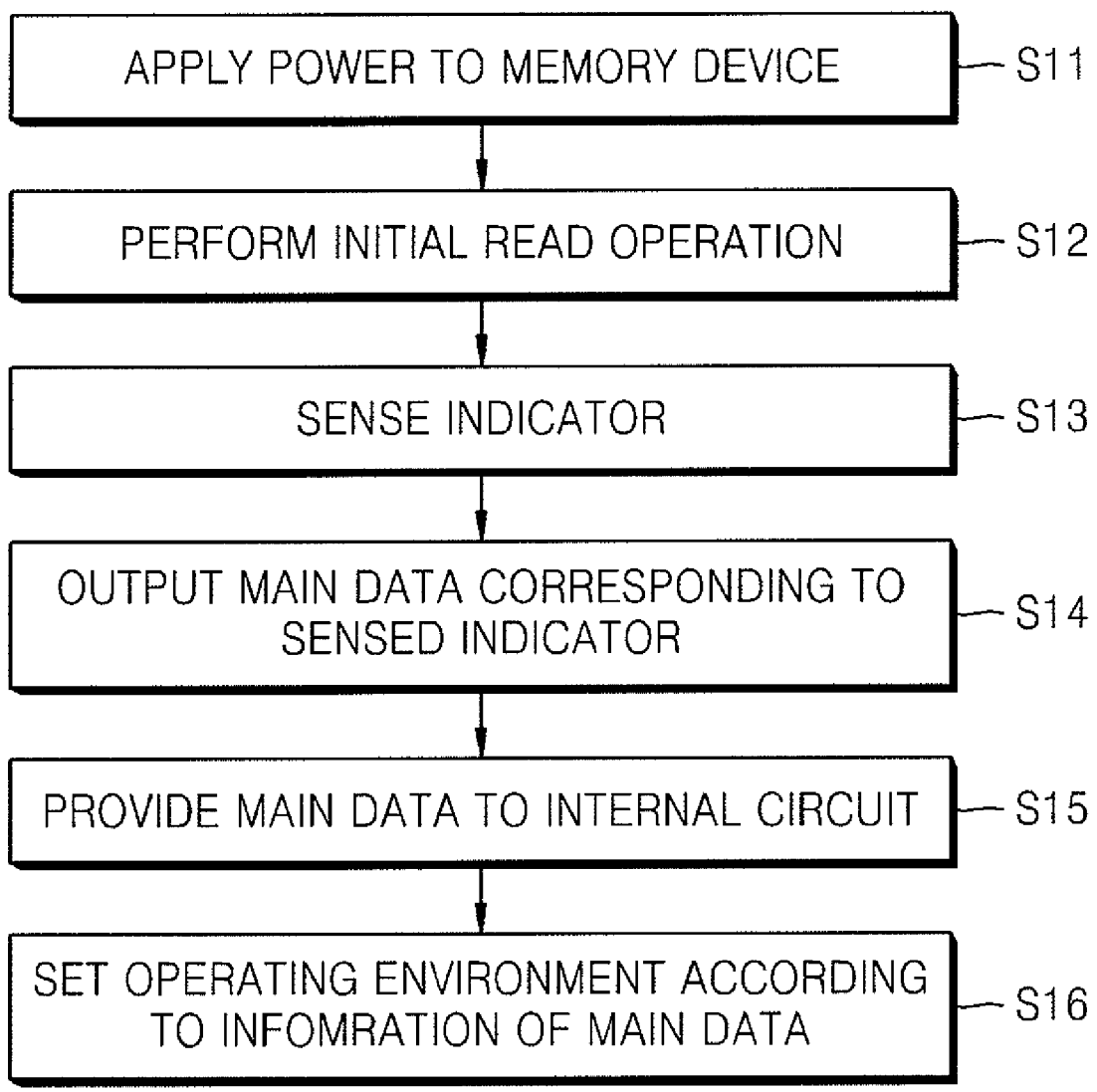
FIG. 10 is a flowchart of a method of driving a non-volatile memory device according to an exemplary embodiment of the present invention.

FIG. 10 is a flowchart of a method of driving a non-volatile memory device according to an exemplary embodiment of the present invention.

Referring to FIG. 10, power is applied to the non-volatile memory device (step S11). Initial setting data associated with an operation of setting an operating environment is stored in a memory cell array of the non-volatile memory device. The initial setting data includes main data having information about the operating environment to be set and an indicator corresponding to the main data for indicating features of the main data. The initial setting data may be stored in a normal column region that is not a fail column region. Fail column regions are column regions in which a plurality of bit lines included in the memory cell array have a defect.

Once power is applied to the non-volatile memory device, an initial read operation is performed on the memory cell array and the operating environment of the non-volatile memory device is set (step S12). Upon output of data according to the read operation, an indicator is sensed from the output data (step S13). Once the indicator is sensed, main data is output (step S14). The main data may be address information for a repair operation, information for controlling the level of a DC voltage, or other information. The output main data is provided to an internal circuit of the non-volatile memory device (step S15). The operating environment of the internal circuit is set according to the information of the main data (step S16).

As described above, according to an exemplary embodiment of the present invention, initial setting data can be stably read from a memory cell array even if a fail column is present, thereby preventing a failure in setting the operating environment of a non-volatile memory device.

While exemplary embodiments of the present invention have been particularly shown and described with reference to the figures, it will be understood by those of ordinary skill in the art that various changes in form and detail may be made therein without departing from the spirit and scope of the present invention.

What is claimed is:

1. A method of driving a non-volatile memory device, the method comprising:
   providing power to the non-volatile memory device having a memory cell array that stores initial setting data for setting an operating environment of the non-volatile memory device;
   performing an initial read operation on the memory cell array; and
   setting the operating environment of the non-volatile memory device using the initial setting data that is read during the initial read operation,
   wherein the initial setting data stored in the memory cell array includes main data including information about the operating environment to be set and an indicator corresponding to the main data, the indicator includes at least one of start information having a first predetermined value and end information having a second predetermined value of the main data,
   wherein the setting the operating environment of the non-volatile memory device comprises:
      sensing the start information included in the indicator from the data read during the initial read operation by detecting information having a value corresponding to the first predetermined value; and
      controlling to provide the main data corresponding to the indicator to an internal circuit of the non-volatile memory device when the start information is sensed.

2. The method of claim 1, further comprising:
   detecting an address of a fail column by testing a plurality of bit lines included in the memory cell array; and
   storing the initial setting data in a normal column, that is not the fail column, based on the detection result.

3. The method of claim 1, wherein the setting of the operating environment comprises:
   sensing an indicator from a result of the initial read operation; and
   providing main data corresponding to the indicator to an internal circuit of the non-volatile memory device according to the sensing result.

4. The method of claim 3, wherein the indicator includes start information indicating the start of the main data and end information indicating the end of the main data.

5. The method of claim 4, wherein the setting of the operating environment comprises:
   sensing the start information from the result of the initial read operation;
   providing the main data to the internal circuit in response to the start information; and
   terminating the providing of the main data in response to the end information.

6. The method of claim 3, wherein the indicator includes start information indicating the start of the main data, the main data being set to have a predetermined size.

7. The method of claim 6, wherein the setting of the operating environment comprises:
   sensing the start information from the result of the initial read operation;
   providing the main data to the internal circuit in response to the start information; and
   providing the main data having the predetermined size and terminating the providing of the main data.

8. The method of claim 1, wherein the initial setting data includes N-bytes of main data for setting a predetermined operation, the N-bytes of main data grouped into a plurality of data groups, wherein the initial setting data additionally includes an indicator corresponding to each of the plurality of data groups, in which N is an integer greater than 1.

9. The method of claim 1, wherein the main data and the corresponding indicator are stored in a same row of the memory cell array, and the start information and the end information of the indicator are positioned on both sides of the main data.

10. A method of driving a non-volatile memory device, the method comprising:
    storing main data having information for setting an operating environment of the non-volatile memory device and an indicator corresponding to the main data;
    performing a read operation on a memory cell array according to an auto-read operation that is performed when power is provided to the non-volatile memory device;
    sensing the indicator from data that is output during the read operation; and
    providing the main data corresponding to the sensed indicator to an internal circuit to set the operating environment of the non-volatile memory device,
    wherein the main data and the indicator are stored in a normal column region of the memory cell array, the normal column region having been determined to be free of defects during testing of a plurality of bit lines included in the memory cell array, and wherein the indicator includes at least one of start information having a first predetermined value and end information having a second predetermined value of the main data, wherein the setting the operating environment of the non-volatile memory device comprises:
       sensing the start information included in the indicator from the data read during the initial read operation by detecting information having a value corresponding to the first predetermined value; and
       controlling to provide the main data corresponding to the indicator to an internal circuit of the non-volatile memory device when the start information is sensed.

11. The method of claim 10, wherein the indicator corresponding to the main data includes start information indicating a start of the main data and end information indicating an end of the main data, and
    the main data is provided to the internal circuit by sensing the start information of the indicator and the providing of the main data is terminated by sensing the end information of the indicator.

12. The method of claim 10, wherein the main data is set to have a predetermined size, the indicator corresponding to the main data includes start information indicating the start of the main data, and
    the main data is provided to the internal circuit by sensing the start information of the indicator and the main data having the predetermined size is provided to the internal circuit.

13. The method of claim 10, wherein the main data sets a predetermined operation and includes N bytes and the N-byte main data is grouped into a plurality of data groups, in which N is an integer greater than 1, and
    the indicator corresponding to the main data includes an indicator corresponding to each of the plurality of data groups.

14. The method of claim 10, wherein the main data and the corresponding indicator are stored in a same row of the memory cell array, and the start information and the end information of the indicator are positioned on both sides of the main data.

15. A non-volatile memory device comprising:
- a memory cell array storing initial setting data for setting an operating environment of the non-volatile memory device;
- an input/output buffer temporarily storing or outputting data provided from the memory cell array in response to a control signal; and
- an indicator sensing unit sensing data that is read through an initial read operation when power is applied to the non-volatile memory device, providing the control signal to the input/output buffer, and controlling the input/output buffer to provide the initial setting data to an internal circuit of the non-volatile memory device,
- wherein the initial setting data stored in the memory cell array includes main data including information about the operating environment and an indicator corresponding to the main data, the indicator includes at least one of start information having a first predetermined value and end information having a second predetermined value of the main data, and wherein
- the start information included in the indicator is sensed from the data read during the initial read operation by detecting information having a value corresponding to the first predetermined value, and the main data corresponding to the indicator is provided to an internal circuit of the non-volatile memory device when the start information is sensed.

16. The non-volatile memory device of claim 15, wherein the initial setting data is stored in a normal column region that is not a fail column as determined by testing a plurality of bit lines included in the memory cell array.

17. The non-volatile memory device of claim 15, wherein the indicator sensing unit senses the indicator from input data and provides the control signal to the input/output buffer to provide the main data corresponding to the indicator to the internal circuit.

18. The non-volatile memory device of claim 17, wherein the indicator includes start information indicating the start of the main data and end information indicating the end of the main data.

19. The non-volatile memory device of claim 18, wherein the indicator sensing unit provides a first control signal to the input/output buffer to provide the main data to the internal circuit when it senses the start information, and provides a second control signal to the input/output buffer to terminate the providing of the main data when it senses the end information.

20. The non-volatile memory device of claim 17, wherein the main data is set to have N bytes, in which N is an integer greater than 1, and the indicator includes start information indicating a start of the N-byte main data.

21. The non-volatile memory device of claim 15, wherein the initial selling data includes N-bytes of main data for selling a predetermined operation, the N-bytes of main data grouped into a plurality of data groups, and wherein the initial setting data additionally includes an indicator corresponding to each of the plurality of data groups, in which N is an integer greater than 1.

22. The non-volatile memory device of claim 15, wherein the main data and the corresponding indicator are stored in a same row of the memory cell array, and the start information and the end information of the indicator are positioned on both sides of the main data.

23. A non-volatile memory device comprising:
- a memory cell array storing initial setting data for setting an operating environment of the non-volatile memory device;
- an input/output buffer temporarily storing or outputting data provided from the memory cell array in response to a control signal; and
- an indicator sensing unit sensing data that is read through an initial read operation when power is applied to the non-volatile memory device, providing the control signal to the input/output buffer, and controlling the input/output buffer to provide the initial setting data to an internal circuit of the non-volatile memory device,
- wherein the initial setting data stored in the memory cell array includes main data including information about the operating environment and an indicator corresponding to the main data for indicating at least one of a start and an end of the main data,
- wherein the indicator sensing unit senses the indicator from input data and provides the control signal to the input/output buffer to provide the main data corresponding to the indicator to the internal circuit, and
- wherein the main data is set to have N bytes, in which N is an integer greater than 1, and the indicator includes start information indicating a start of the N-byte main data, and
- further comprising a counting unit that is electrically connected to the indicator sensing unit, wherein the counting unit starts a counting operation when the start information is sensed, and performs the counting operation for the N bytes of main data.

24. The non-volatile memory device of claim 23, wherein the indicator sensing unit provides a first control signal to the input/output buffer to provide the main data corresponding to the start information to the internal circuit when it senses the start information, and provides a second control signal to the input/output buffer to terminate the providing of the main data upon completion of the counting operation for the N bytes of main data.

* * * * *